(12) United States Patent
Nakazawa et al.

(10) Patent No.: US 7,211,862 B2
(45) Date of Patent: May 1, 2007

(54) SEMICONDUCTOR DEVICE AND A METHOD OF MANUFACTURING THE SAME

(75) Inventors: Yoshito Nakazawa, Isesaki (JP); Yuji Yatsuda, Kumagaya (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/249,335

(22) Filed: Oct. 14, 2005

(65) Prior Publication Data

US 2006/0027862 A1    Feb. 9, 2006

Related U.S. Application Data

(63) Continuation of application No. 10/885,319, filed on Jul. 7, 2004, now Pat. No. 6,977,416.

(30) Foreign Application Priority Data

Aug. 4, 2003   (JP) ............................... 2003-286141

(51) Int. Cl.
*H01L 29/94* (2006.01)

(52) U.S. Cl. ...................... 257/330; 257/341

(58) Field of Classification Search ................ 257/341, 257/330–335
See application file for complete search history.

(56) References Cited

U.S. PATENT DOCUMENTS

| 6,057,558 A | 5/2000 | Yamamoto et al. |
| 6,710,403 B2 | 3/2004 | Sapp |

*Primary Examiner*—Douglas W. Owens
(74) *Attorney, Agent, or Firm*—Reed Smith LLP; Stanley P. Fisher, Esq.; Juan Carlos A. Marquez, Esq.

(57) ABSTRACT

A semiconductor device wherein an avalanche withstand of power MISFET is improved without enlarging cell pitch. In the semiconductor device, impurity ions having a p-type conduction, e.g. B ions, are introduced from a bottom of a contact hole to form a p-type semiconductive region that is provided below a $p^+$-type semiconductive region and in contact with the $p^+$-type semiconductive region and an $n^-$-type single crystal silicon layer and that has an impurity concentration lower than the $p^+$-type semiconductive region. An n-type semiconductive region is formed in the $n^-$-type single crystal silicon layer provided below the p-type semiconductive region as being in contact with the p-type semiconductive region and has an impurity concentration lower than the $n^-$-type single crystal silicon layer.

6 Claims, 10 Drawing Sheets

SEMICONDUCTOR DEVICE AND A METHOD OF MANUFACTURING THE SAME

CROSS-REFERENCE TO RELATED APPLICATION

This application is a Continuation of U.S. application Ser. No. 10/885,319 filed on Jul. 7, 2004 now U.S. Pat. No. 6,977,416. The present application claims priority from U.S. application Ser. No. 10/885,319 filed on Jul. 7, 2004, which claims priority from Japanese Patent application JP 2003-286141 filed on Aug. 4, 2003, all of which is hereby incorporated by reference as if set forth in the entirety herein.

FIELD OF THE INVENTION

This invention relates to a semiconductor device and a method of manufacturing the same. More particularly, the invention relates to a semiconductor device and method for a power MISFET (metal insulator field effect transistor).

BACKGROUND OF THE INVENTION

A transistor for high power purposes that can handle electric power of several watts or over is called a power transistor. Of such power transistors, a power MISFET includes a longitudinal type and a horizontal type, and may be classified as a trench (groove) gate type and a planar gate type, depending on the gate structure.

The need to prevent the breakdown of a gate oxide film is known. For instance, in a trench gate-type power MISFET formed on a semiconductor substrate, and having an $n^-$-type epitaxial layer, an $n^+$-epitaxial layer, and a p-type epitaxial layer stacked successively, a gate electrode layer formed within a groove that is formed through the p-type epitaxial layer and the $n^+$-type epitaxial layer and that reaches the $n^-$-type epitaxial layer, and an n-type thin film semiconductor layer formed at side surfaces of the groove, a $pn^+n^-$ diode is formed with use of the p-type epitaxial layer, the $n^+$-type epitaxial layer, and the $n^-$-type epitaxial layer. In this arrangement, the impurity concentration and thickness of the $n^+$-type epitaxial layer are controlled so that the breakdown voltage of the $pn^+n^-$ diode is lower than that of the surface of a gate oxide provided at the bottom of the groove. As a result, the $pn^+n^-$ diode could be subject to avalanche breakdown more readily than the surface of the gate oxide film, thereby preventing the breakdown of the gate oxide film. Such an arrangement is taught, for example, in Japanese Unexamined Patent Publication No. Hei 10 (1998)-308512.

Further, there is known another technique of improving dielectric breakdown of a trench gate-type power MISFET including a channel forming layer on the upper surface of a semiconductor substrate. In that MISFET, a source region is provided at a surface layer portion of the channel forming layer, and a groove is provided at the center of the source region so as to reach the drain region, and a gate electrode is provided on the inner walls of the groove. In this technique, the gate oxide film is locally made thick, thereby permitting the concentration of an electric field at the corner portions of the groove bottom to be mitigated to provide for the improvement of dielectric breakdown. Such a technique is disclosed, for example, in Japanese Unexamined Patent Publication No. Hei 01 (1989)-192175.

SUMMARY OF THE INVENTION

In a power MISFET, great electric power is obtained by adopting a structure that includes a multitude of MISFETs having fine patterns that are, for example, connected in parallel. An instance is illustrated with reference to FIG. 18.

For instance, in a trench gate-type power MISFET, an n-type epitaxial layer 102, a p-type channel layer 103 and an n-type semiconductor layer 104 serving as a source region are successively formed on an n-type semiconductor substrate 101 (hereinafter also referred to as substrate) that becomes a drain region. In this condition, a p-type semiconductor layer 105 of high concentration is formed in the vicinity of the junction between the epitaxial layer 102, and the channel layer 103 provided below the contact region of the source and channel. In this way, an avalanche breakdown point is positively formed when the channel layer 103 and the epitaxial layer 102 are reverse biased to the extent of breakdown. This enables suppression of the operation of a parasitic npn-type bipolar transistor caused by the epitaxial layer 102 as a collector, the channel layer 103 as a base and the n-type semiconductor layer as an emitter, thus ensuring an improved avalanche withstand for the trench gate-type power MISFET.

Where a positive avalanche breakdown point is not established, the vicinity of the interface between a gate oxide film 107 and the epitaxial layer 102 may become an avalanche breakdown point. The holes generated through ionization by collision pass below the source, after which they flow into the contact region of the channel. When the resistance of the channel layer 102 below the source is high, the base and emitter of the parasitic npn-type bipolar transistor is forward biased, due to the voltage drop caused by the hole current of the bipolar operation, thereby causing the avalanche withstand to be lowered.

Where such a MISFET is used for switching purposes, the load of a switching element frequently becomes an inductive load, and when the element is turned off, an excess spike voltage transiently generates due to the inductance in the circuit. The application of this spike voltage at a level higher than the breakdown voltage of the element results, in some cases, in breakage of the element. Where a positive avalanche breakdown point is formed below the contact region of the source and the channel, the holes generated through ionization by collision are likely to directly flow into the contact region of the channel, which is unlikely to cause the operation of the parasitic npn-type bipolar transistor, thereby improving the avalanche withstand.

To form the above-mentioned p-type semiconductor layer 105, a self-aligned p-type semiconductor layer 105 is formed in such a way that the epitaxial layer 102, channel layer 103 and n-type semiconductor layer 104 are formed, under which an insulating film 108 is deposited over the substrate 101. The insulating film 108 is formed with a hole 109 that reaches the channel layer 103 through the n-type semiconductor layer 104. Thereafter, p-type impurity ions (e.g. B (boron)) are introduced from the hole 109 by application of a relatively high energy, so as to increase a concentration of the p-type impurity in the vicinity of the junction between the channel layer 103 and the epitaxial layer 102. However, when the energy used for introducing the p-type impurity ions is high, the width of a distribution along the lateral direction of the introduced p-type impurity ions may become great, so that the characteristic properties, such as a threshold voltage, on resistance and the like, of the trench gate-type power MISFET are degraded. To suppress such a disadvantage, a liberal distance from the p-type semiconductor layer 105 to the groove 106 formed with a gate electrode 110 may be provided. However, cell pitches of the trench gate-type power MISFET may be thereby broadened. Moreover, when the energy used for the introduction of p-type impurity ions is lowered so as to suppress the width of distribution along the lateral direction of the introduced p-type impurity ions from broadening, the concentration of the p-type impurity may not be well enhanced in the vicinity of the junction between the channel layer 103 and the epitaxial layer 102. Such an instance prevents improvement of the avalanche withstand of the trench gate-type MISFET.

Thus, the present invention provides an apparatus, system, and method for improving avalanche withstand of power MISFET without enlarging cell pitches. There may be provided a semiconductor device having a semiconductor substrate formed with a plurality of MISFETs. The device may include a first semiconductor layer of a first conduction type formed over a main surface of the semiconductor substrate; a plurality of second semiconductor layers of a second conduction type opposite to the first conduction type, each formed over the first semiconductor layer; a plurality of third semiconductor layers of the first conduction type formed over the second semiconductor layers; a gate electrode formed between coplanar, adjacent third semiconductor layers; a first insulating film formed over the third semiconductor layer and the gate electrode; a plurality of first grooves each formed over the first insulating film in such a manner as to be arranged between coplanar, adjacent gate electrodes and being in contact with the third semiconductor layers; a fourth semiconductor layer of the first conduction type formed between coplanar, adjacent gate electrodes and in contact with the second semiconductor layer within the first semiconductor layer; a fifth semiconductor layer of the second conduction type formed in contact with a bottom of the first groove within the second semiconductor layer; and a first electrode formed within the first groove and electrically connected with the third semiconductor layer and the fifth semiconductor layer, wherein the first semiconductor layer and the third semiconductor layer form a source or drain of the MISFET, the second semiconductor layer forms a channel forming region, and the fourth semiconductor layer has an impurity concentration higher than the first semiconductor layer.

The method of a semiconductor device according to the invention may include a method of manufacturing a semiconductor device having a plurality of MISFETs. The method may include the steps of forming a first semiconductor layer of first conduction type over a main surface of a semiconductor substrate; introducing an impurity of a second conduction type opposite to the first conduction type into the semiconductor substrate to from a second semiconductor layer of the second conduction type over the first semiconductor layer; forming gate electrodes over the semiconductor substrate; forming a third semiconductor layer of the first conduction type over the second semiconductor layer; forming a first insulating film over the third semiconductor layer and the gate electrodes; forming a plurality of first grooves, which reach the first insulating film and the third semiconductor layer, so as to be arranged between coplanar, adjacent gate electrodes; introducing an impurity of the second conduction type from the bottoms of the first grooves to form, within the second semiconductor layer, a fifth semiconductor layer of the second conduction type in contact with the bottoms of the first grooves; introducing an impurity of the second conduction type from the bottoms of the first grooves to form, within the second semiconductor layer, a sixth semiconductor layer of the second conduction type in contact with the fifth semiconductor layer; introducing an impurity of the first conduction type from the bottoms of the first grooves to form, within the first semiconductor layer, a fourth semiconductor layer in contact with the fifth semiconductor layer; and forming a first electrode for electric connection between the third semiconductor layer and the fifth semiconductor layer inside the first grooves, wherein the third semiconductor layer is so formed that the gate electrode is arranged between coplanar, adjacent third semiconductor layers, and wherein the fourth semiconductor layer is so formed that an impurity concentration in the fourth semiconductor layer is higher than an impurity concentration in the first semiconductor layer, wherein an impurity concentration in the sixth semiconductor layer is lower than an impurity concentration in the fifth semiconductor layer, and wherein the first semiconductor layer and the third semiconductor layer are used as a source or drain, and the second semiconductor layer is provided as a channel forming region, thereby forming a MISFET.

Thus, the present invention provides a MISFET having improved avalanche withstand of MISFET without enlarging cell pitches.

BRIEF DESCRIPTION OF THE DRAWINGS

The various features of the present invention will now be described in greater detail with reference to the drawings of aspects of the present invention, and various related elements thereof, wherein like reference numerals designate like elements, and wherein.

DETAILED DESCRIPTION

It is to be understood that the figures and descriptions of the present invention have been simplified to illustrate elements that are relevant for a clear understanding of the present invention, while eliminating, for purposes of clarity, many other elements found in a typical semiconductor device and method. Those of ordinary skill in the art will recognize that other elements are desirable and/or required in order to implement the present invention. But because such elements are well known in the art, and because they do not facilitate a better understanding of the present invention, a discussion of such elements is not provided herein. The disclosure herein is directed to all such variations and modifications to the applications, networks, systems and methods disclosed herein and as will be known, or apparent, to those skilled in the art.

A semiconductor device of an embodiment includes a trench gate-type power MISFET of an n channel type wherein the breakdown voltage between the source and drain is, for example, at 100 V or below. The device, and a method of manufacturing such a semiconductor device, are illustrated with reference to FIGS. 1 to 11.

Figure 1:
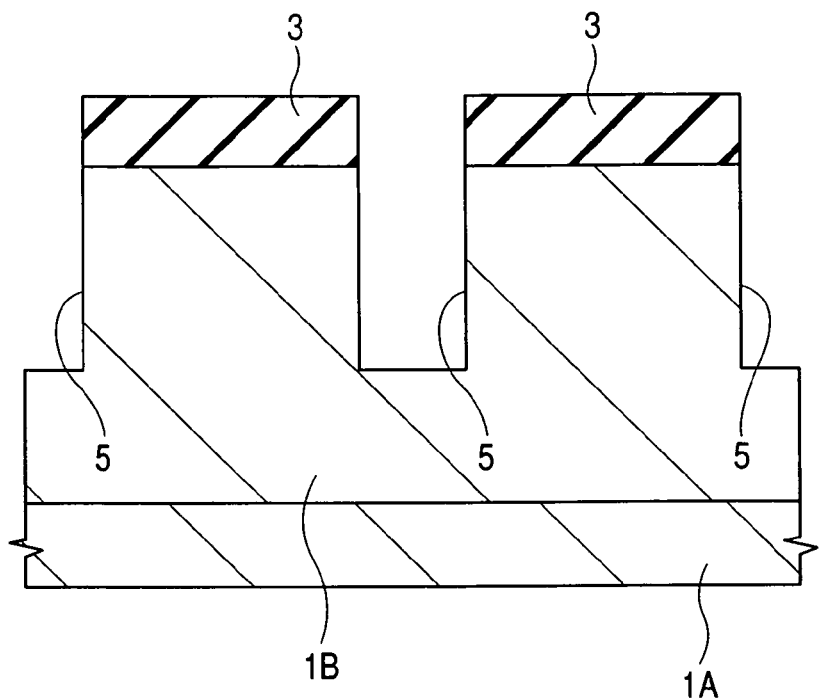
FIG. 1 is a sectional view of a semiconductor device.

As shown in FIG. 1, a semiconductor substrate (a substrate), obtained by epitaxially growing an $n^-$-type single crystal silicon layer (first semiconductor layer) 1B on the surface (main surface) of an $n^+$-type single crystal silicon substrate 1A having an n-type conduction (first conduction type), is provided. The $n^+$-type single crystal silicon substrate 1A and the $n^-$ type single crystal silicon layer 1B serve as a drain region of the power MISFET in subsequent steps. Thereafter, the $n^-$-type single crystal silicon layer 1B is, for example, thermally oxidized on the surface thereof (main surface) to form a silicon oxide film 3. The silicon oxide film 3 and the $n^-$-type single crystal silicon layer 1B are etched using a photoresist film patterned by use of a photolithographic technique and provided as a mask, thereby forming grooves 5 (second grooves). This groove 5 is formed as a mesh-shaped pattern, such as of a tetragon, a hexagon, an octagon or the like, or a striped pattern wherein a number of grooves extend in the same direction.

Figure 2:
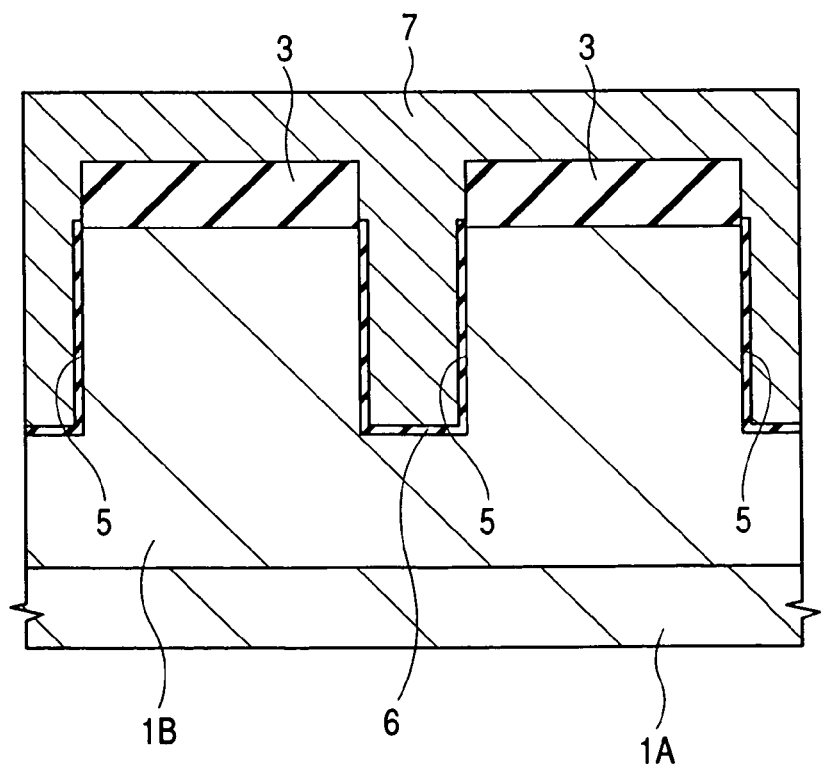
FIG. 2 is a sectional view of the semiconductor device subsequent to FIG. 1.

As shown in FIG. 2, the substrate is subjected to thermal oxidation to form a silicon oxide film (second insulating film) 6 on the side walls and bottom of the groove 5. This silicon oxide film 6 serves as a gate insulating film of the power MISFET. Subsequently, a polysilicon film (conductor) 7 doped, for example, with P is deposited on the silicon oxide film 3, including on the inside of the groove 5, to fill the groove 5 with the polysilicon film 7.

Figure 3:
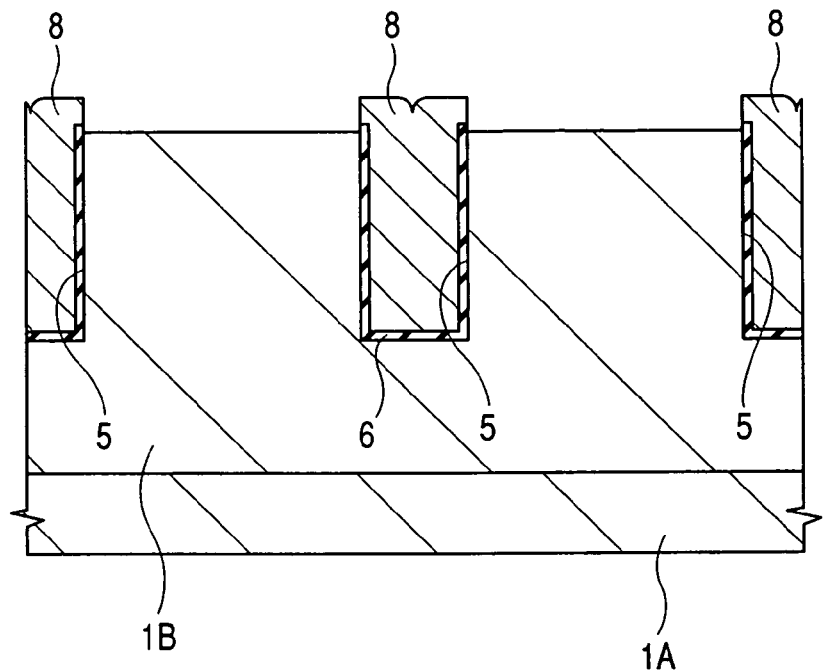
FIG. 3 is a sectional view of the semiconductor device subsequent to FIG. 2.

As shown in FIG. 3, the polysilicon film 7 is etched using a mask of a photoresist film patterned according to a photolithographic technique, thereby leaving the polysilicon film 7 in the groove 5 to form a gate electrode 8 of the power MISFET in the groove 5. Thereafter, the silicon oxide film 3 is etched through a mask of a photoresist film patterned according to a photolithographic technique to remove unnecessary silicon oxide film 3, thereby forming a field insulating film from the silicon oxide film 3.

Figure 4:
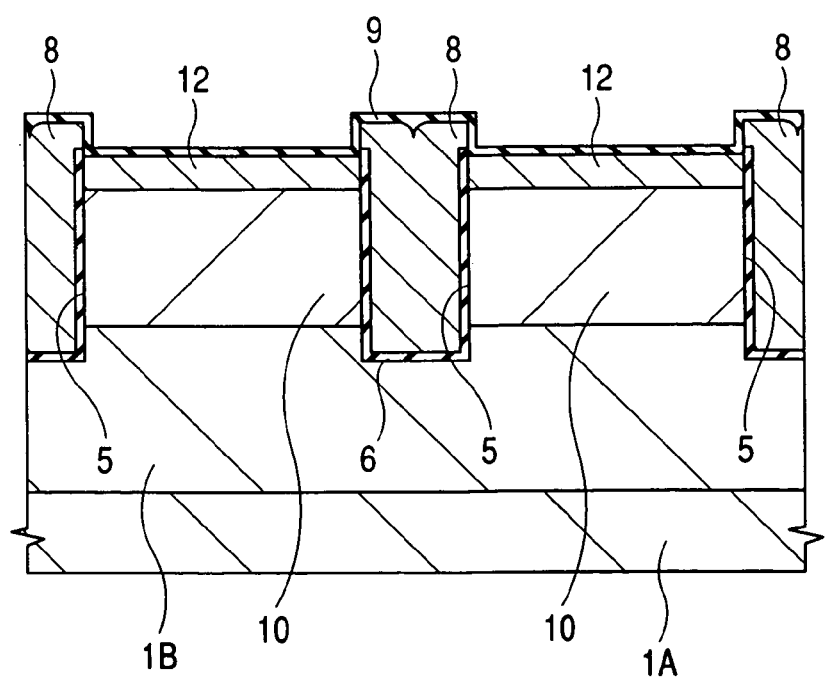
FIG. 4 is a sectional view of the semiconductor device subsequent to FIG. 3.

As shown in FIG. 4, a silicon oxide film 9 is deposited on the surface of the $n^-$-type single crystal silicon layer 1B. Subsequently, impurity ions (e.g. B (boron)) of a p-type conduction type (second conduction type) are introduced into the $n^-$-type single crystal silicon layer 1B at a given concentration through a mask of a photoresist film patterned according to a photolithographic technique. Next, the substrate is thermally oxidized to permit the impurity ions to be diffused to form a $p^-$-type semiconductive region (second semiconductor layer) 10. At this stage, the $p^-$-type semiconductive region 10 is so formed as not to cover the bottom of the groove 5. This $p^-$-type semiconductive region 10 serves as a channel layer of the power MISFET after formation of the power MISFET.

Subsequently, impurity ions having an n-type conduction type (e.g. As (arsenic)) are introduced into the substrate through a mask of a photoresist film patterned according to a photolithographic technique. Thereafter, the substrate is thermally oxidized to permit the impurity ions to be diffused to form an $n^+$-type semiconductive region (third semiconductor layer) 12 within the $p^-$-type semiconductive region 10. According to the steps stated hereinabove, there can be formed power MISFET wherein the $n^+$-type single crystal silicon substrate 1A and the $n^-$type single crystal silicon layer 1B are, respectively, provided as a drain region, and the $n^+$-type semiconductive region 12 is provided as a source region.

Figure 5:
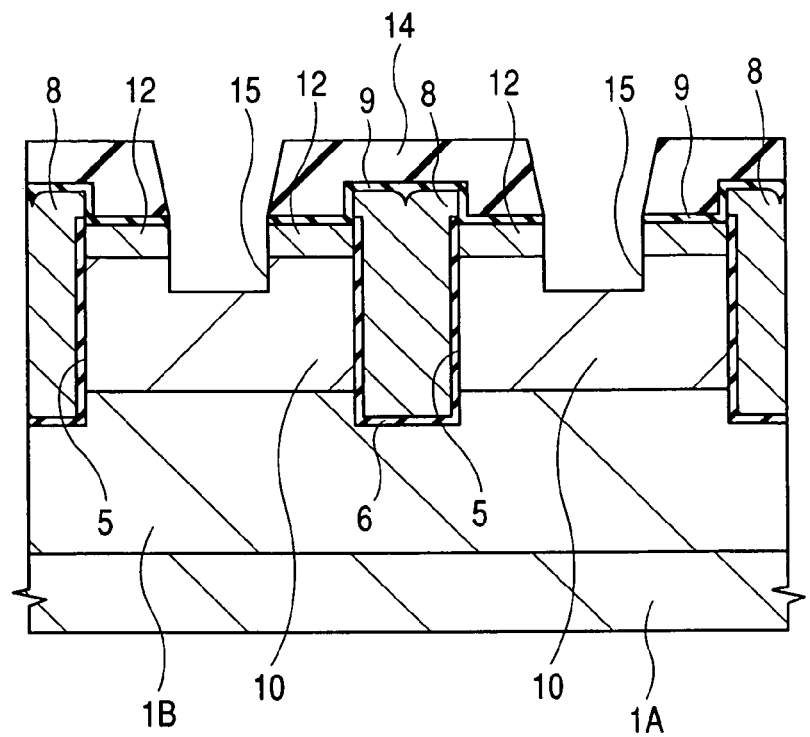
FIG. 5 is a sectional view of the semiconductor device subsequent to FIG. 4.

As shown in FIG. 5, a PSG (Phospho Silicate Glass) film is, for example, deposited over the substrate, after which an SOG (spin on Glass) film is applied onto the PSG film to form an insulating film (first insulating film) 14 of the PSG film and SOG film. Subsequently, the insulating film 14 and the substrate are etched through a mask of a photoresist film patterned according to a photolithographic technique, thereby forming a contact groove (first groove) 15. The contact groove 15 is formed to pass through the $n^+$-type semiconductive region 12, which becomes a source region of a power MISFET, between adjacent gate electrodes 8.

Figure 6:
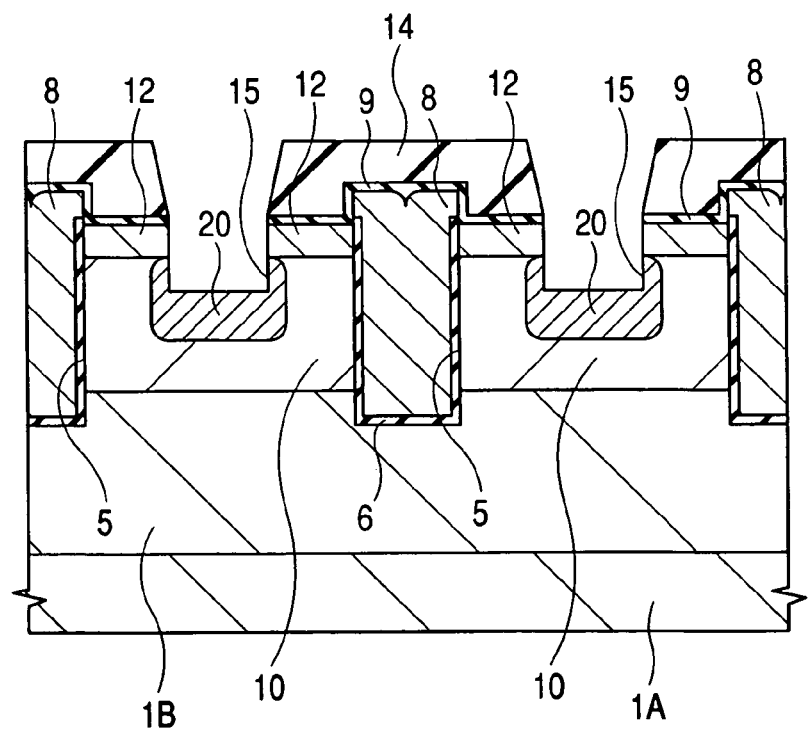
FIG. 6 is a sectional view of the semiconductor device subsequent to FIG. 5.

As shown in FIG. 6, impurity ions of the p-type conduction type, e.g. $BF_2$ (boron difluoride), are introduced from the bottom of the contact groove 15, thereby forming a $p^+$-type semiconductive region (fifth semiconductor layer) 20 so as to cover the bottom of the contact groove 15. At this stage, the implantation energy of $BF_2$ is, for example, at about 80 keV (about 11/49×80 keV calculated in terms of B (boron)). In this way, the contact groove 15 is formed so that the impurity ions are introduced from the contact groove 15 using the mask of the insulating film 14, thereby self-alignedly forming the $p^+$-type semiconductive region 20 at the bottom of the contact groove 15. Hence, an allowance for mask registration can be reduced, thereby permitting microfabrication of an area between adjacent gate electrodes 8. This $p^+$-type semiconductive region 20 is provided for ohmic contact of wiring, formed in a subsequent step, with the $p^-$-type semiconductive region 10 at the bottom of the contact groove 15.

Figure 7:
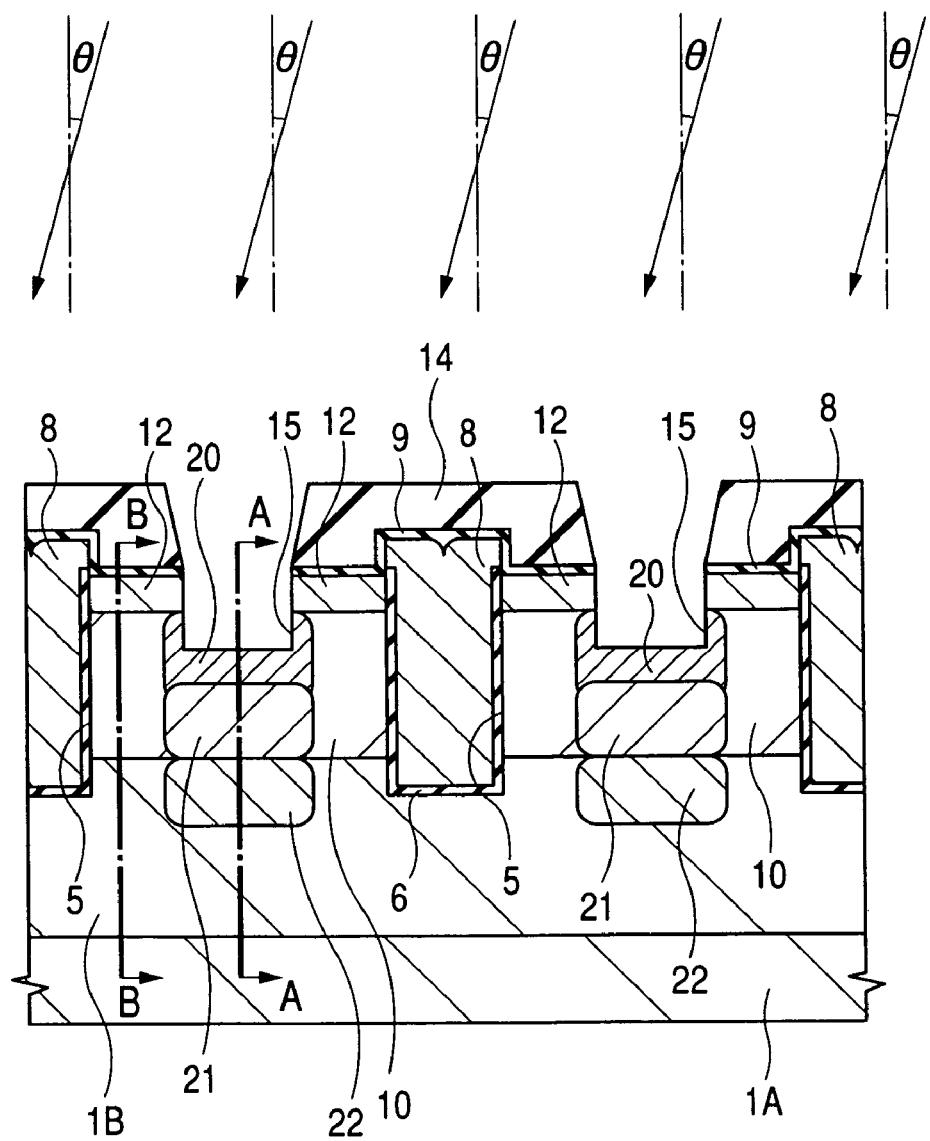
FIG. 7 is a sectional view of the semiconductor device subsequent to FIG. 6.

As shown in FIG. 7, impurity ions of a p-type conduction type, e.g. B, are introduced from the bottom of the contact groove 15 to form a p-type semiconductive region (sixth semiconductor layer) 21 in contact with the $p^+$-type semiconductive region 20 and the $n^-$type single crystal silicon layer 1B at the lower portion of the $p^+$-type semiconductive region 20. The implantation energy of B can be, for example, at about 70 keV to 150 keV. The impurity concentration in the p-type semiconductive region 21 is made lower than the impurity concentration in the $p^+$-type semiconductive region 20. Like the formation of the $p^+$-type semiconductive region 20, impurity ions are introduced from the contact groove 15 through the mask of the insulating film 14 to self-alignedly provide the p-type semiconductive region 21 at the lower portion of the contact groove 15. Hence, the allowance for mask registration can be reduced, thereby permitting an area between adjacent gate electrodes 8 to be microfabricated.

Subsequently, impurity ions of the n-type conduction, e.g. P or As, are introduced from the bottom of the contact groove 15 to form an n-type semiconductive region (fourth semiconductor layer) 22 in contact with the p-type semiconductive region 21 (p⁻-type semiconductive region 10) at the n⁻-type single crystal silicon 1B that is a lower portion of the p-type semiconductive region 21. The implantation energy of P can be, for example, at about 400 keV. The impurity concentration in the n-type semiconductive region 22 is made higher than the impurity concentration in the n⁻-type single crystal silicon 1B. Like the formation of the p⁺-type semiconductive region 20 and the p-type semiconductive region 21, impurity ions are introduced from the contact groove 15 through a mask of the insulating film 14 to self-alignedly provide the n-type semiconductive region 22 at the lower portion of the contact groove 15. Hence, an allowance for mask registration can be reduced, thereby permitting an area between adjacent gate electrodes 8 to be microfabricated.

Figure 8:
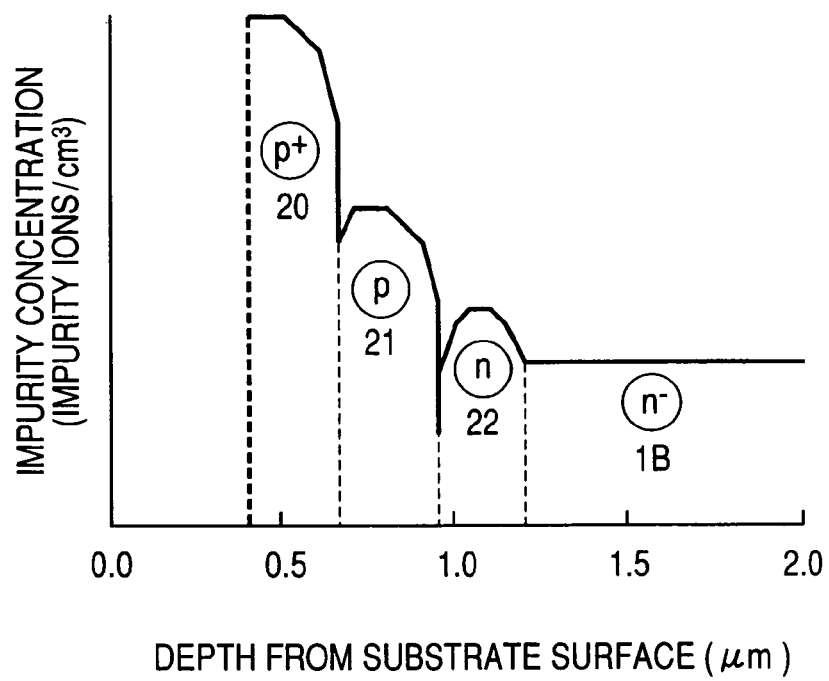
FIG. 8 is an illustrative view showing the relation between the depth of a substrate along the line A—A in FIG. 7 and the concentration of impurity ions introduced into the substrate.
Figure 9:
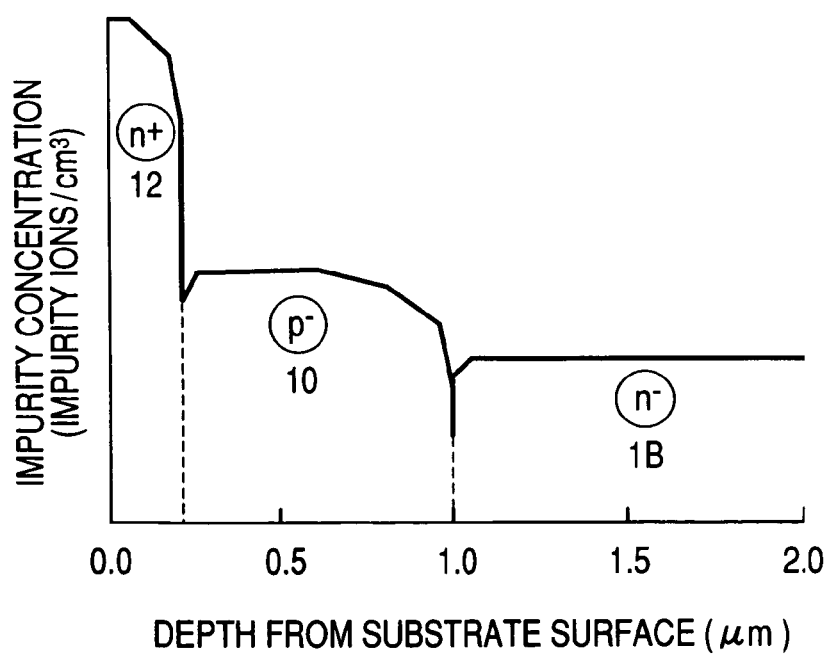
FIG. 9 is an illustrative view showing the relation between the depth of a substrate along the line A—A in FIG. 8 and the concentration of impurity ions introduced into the substrate.

The relations between the depths from the surface (main surface) of the substrate at positions along lines A—A and B—B shown in FIG. 7, and the impurity concentration introduced into the substrate are, respectively, shown in FIGS. 8 and 9. It will be noted that in FIGS. 8 and 9, regions indicated by 1B, 10, 12, 20, 21 and 22 are those regions, respectively, corresponding to n⁻-type single crystal silicon 1B, p⁻-type semiconductive region 10, n⁺-type semiconductive region 12, p⁺-type semiconductive region 20, p-type semiconductive region 21 and n-type semiconductive region 22.

When impurity ions are introduced into the substrate, impurity ions are apt to cause channeling as they are introduced more deeply. For instance, the p-type semiconductive region 21 and the n-type semiconductive region 22 may deviate from desired positions with respect to the depth thereof. When the main surface of the substrate is viewed from the direction vertical to the main surface of the substrate, the lattice atoms constituting the substrate are arranged in rows and are observed to create a tunnel. The introduction of impurity ions into the main surface of such a substrate causes the ions to be entered through the tunnel into the substrate more deeply. This phenomenon may be established in an interdependent relation to an orientation of the crystal face at the main surface of a substrate, an angle of incidence of impurity ions relative to a crystal face, the type of impurity ion, the implantation energy of impurity ions, and the state of a substrate surface.

The orientation of the crystal face at the main surface of the substrate is taken as (100), and impurity ions are introduced from one direction, inclined only at an appropriate angle of θ from a direction vertical to the main surface of the substrate, upon formation of the p-type semiconductive region 21 and the n-type semiconductive region 22. The angle of θ, may be, for example, about 7°. The introduction of impurity ions from such a direction can prevent the discrepancy that impurity ions bring about by channeling upon formation of the p-type semiconductive region 21 and the n-type semiconductive region 22, so that the p-type semiconductive region 21 and the n-type semiconductive region 22 can be formed at a desired depth, respectively. It will be noted that, with respect to the p⁺-type semiconductive region 20, the region is formed more shallow than the p-type semiconductive region 21 and the n-type semiconductive region 22, and is thus formed by introducing impurity ions from a direction vertical to the main surface of the substrate.

Figure 10:
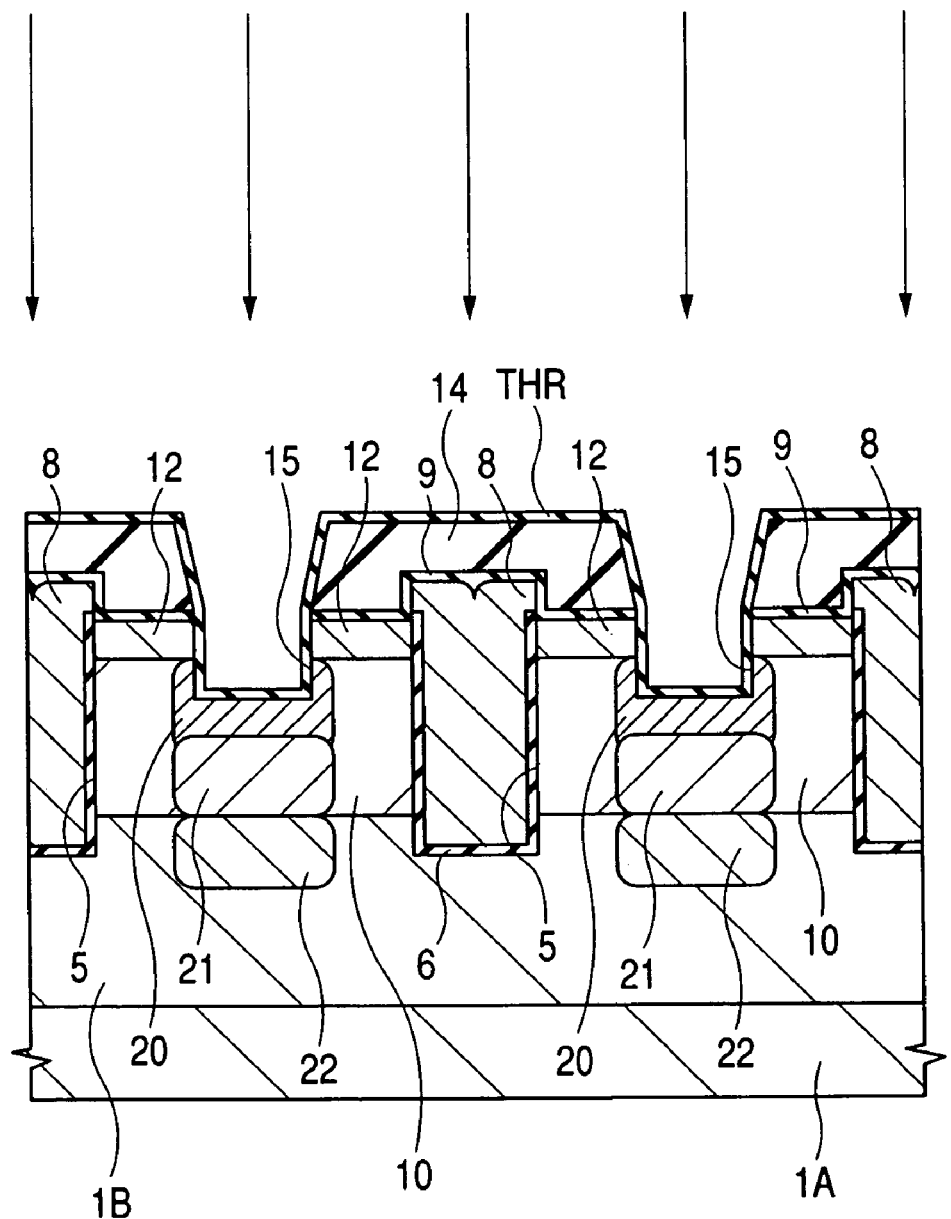
FIG. 10 is a sectional view of the semiconductor device.

Also to prevent channeling, as shown in FIG. 10, an approximately 200☐thick silicon oxide film (third insulating film) THR may be deposited on the insulating film 14, including on the inside of the contact groove 15, under which impurity ions are introduced through the silicon oxide film THR from a direction vertical to the main surface of the substrate. The formation of such a silicon oxide film THR on the insulating film 14, including on the inside of the contact groove 15, results in the state where the tunnel, as mentioned hereinabove, is filled.

Eventually, upon introduction of impurity ions, the impurity ions collide with the silicon oxide film THR and are scattered. Moreover, the introduction of the impurity ions through the silicon oxide film THR can prevent the channeling of the impurity ions, even along a direction parallel to the main surface of the substrate, and thus the difficulty of forming the p-type semiconductive region 21 and the n-type semiconductive region 22 at desired positions in a direction parallel to the main surface of the substrate can be avoided.

Figure 11:
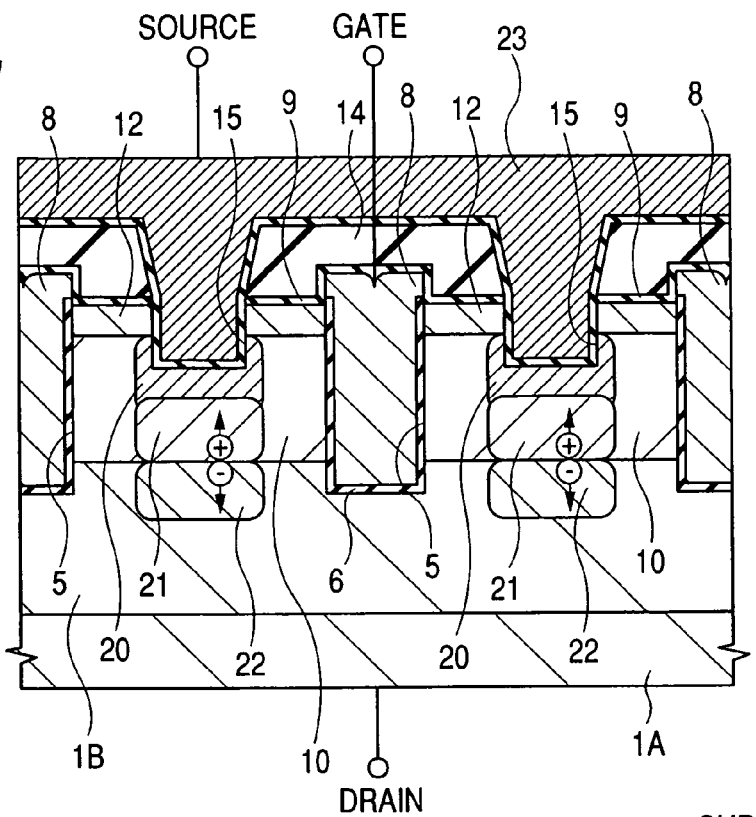
FIG. 11 is a sectional view of the semiconductor device subsequent to FIG. 7.
Figure 12:
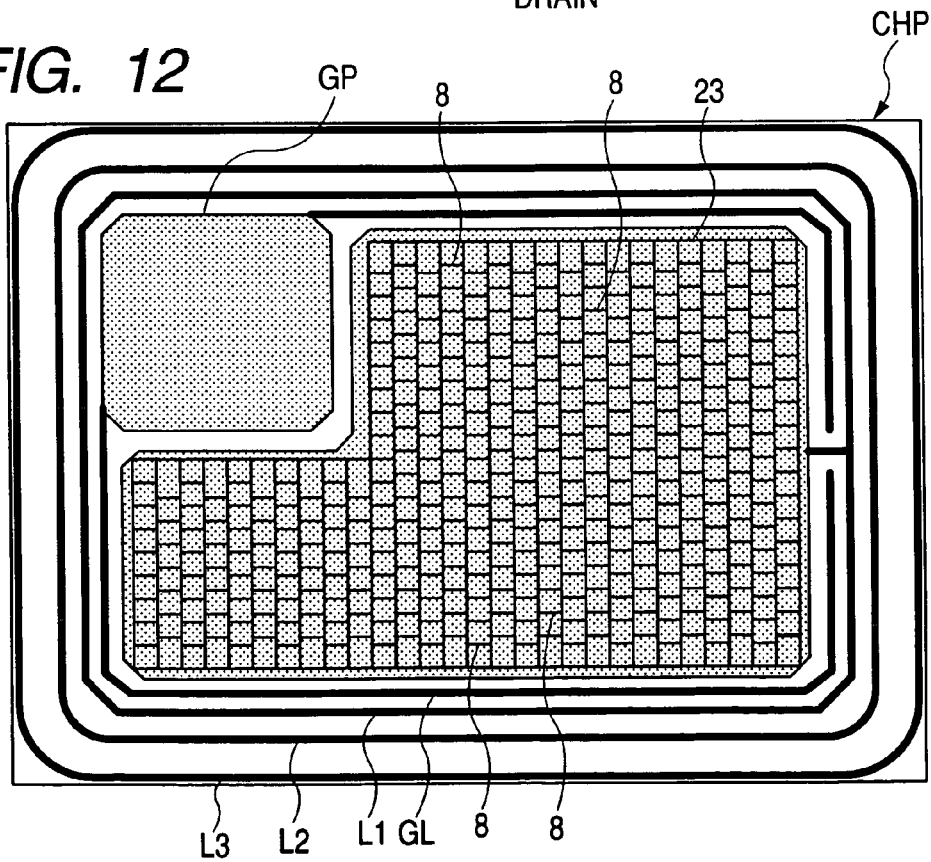
FIG. 12 is a plan view of the semiconductor device.

As shown in FIGS. 11 and 12, a TiW (titanium tungsten) film serving as a barrier conductor film is thinly deposited on the top of the insulating film 14, including on the inside of the contact groove 15, for example, by a sputtering method, followed by thermal treatment of the substrate. Subsequently, an Al (aluminium) film is deposited on the TiW film, for example, by a sputtering method. The barrier conductor film serves to prevent the formation of an undesirable reaction layer through contact of the barrier conductor film with the Al and the substrate (Si). As used herein, the Al film means a film mainly composed of Al in which other metal or metals may be contained.

Thereafter, the TiW film and Al film are, respectively, etched using a mask of a photoresist film patterned according to a photolithographic technique, to form a gate line GL electrically connected to the gate electrode 8, a source pad (source electrode (first electrode)) 23 electrically connected to the n⁺-type semiconductive region 12, which becomes a source region of the power MISFET, a gate pad GP electrically connected to the gate line GL, a line L1 electrically connected to the source pad 23, and lines L2, L3. It will be noted here that FIG. 12 shows a chip region CHP corresponding to one chip when the substrate 1 is divided into individual chips in a subsequent step, in which the planar pattern of the groove 5 is depicted as square meshes.

In order to improve the avalanche withstand of the trench gate-type power MISFET, suppression may be performed of the operation of a parasitic npn-type bipolar transistor, including the n⁻-type single crystal silicon layer 1B as a collector, the p⁻-type semiconductive region 10 as a base and the n⁺-type semiconductive region 12 as an emitter. In this arrangement, a highly concentrated p-type semiconductive region is formed, without forming the p-type semiconductive region 21 and the n-type semiconductive region 22, in the vicinity of the junction between the n⁻-type single crystal silicon layer 1B and the p⁻-type semiconductive region 10 thereby positively forming an avalanche breakdown point.

To the formation of such a highly concentrated p-type semiconductive region, p-type impurity ions (e.g. boron) are introduced, for example, from the contact groove 15 at a relatively high energy, thereby self-alignedly forming a p-type semiconductor layer. However, if the energy used for introducing the p-type semiconductor layer is high, the introduced p-type impurity ions are distributed widely along a direction parallel to the main surface of the substrate, with the possibility that characteristics of the trench gate-type power MISFET, such as threshold voltage and on resistance, will be degraded. To suppress such an inconvenience, there may be a measure of distance between the p-type semiconductor layer and the groove 5 at which the gate electrode 8 is formed. If such a measure is adopted, cell pitches of the trench gate-type power MISFET may be disadvantageously enlarged. In addition, if the energy used for introducing p-type impurity ions is low to suppress the width of distribution of the p-type impurity ions along a direction parallel to the main surface of the substrate from broadening, the concentration of the p-type impurity cannot be increased sufficiently in the vicinity of the junction between the n⁻-type single crystal silicon layer 1B and the p⁻-type semiconductive region 10. This may not lead to an improved avalanche withstand of the trench gate-type power MISFET.

Accordingly, impurity ions are introduced at an energy lower than the impurity ion-implanting energy used on formation of the p-type semiconductive region in place of forming such a highly concentrated p-type semiconductive region as set out hereinbefore. As a result, the p-type semiconductive region 21 may be formed (see FIG. 7) at a region shallower than the depth of the p-type semiconductive region having been formed, and the n-type semiconductive region 22 may be formed below the p-type semiconductive region 21, positively forming the avalanche breakdown point. Electron current flows from the avalanche breakdown point toward the n⁺-type single crystal silicon substrate 1A, and a hole current flows toward the p⁺-type semiconductive region 20. The broadening of the distribution width of the impurity ions in a direction parallel to the main surface of the substrate may be suppressed at the time of formation of the p-type semiconductive region 21. With the changing of the avalanche withstand of the trench gate-type power MISFET, the cell pitches of the trench gate-type power MISFET may be reduced. For instance, the cell pitch may be reduced to about 1 μm. The reduction of the cell pitch enables one to form high-density cells, so that the number of parallel connections of channels in the trench gate-type power MISFET may be increased, permitting the channel resistance to be reduced. The impurity concentration of the n⁻-type single crystal silicon layer 1B may become high for a trench gate-type power MISFET wherein the breakdown voltage between the source and drain is lower (e.g. about 100 V or below). As the breakdown voltage between the source and drain tends toward a lower level, the on resistance of the trench gate-type power MISFET may rely on the channel (p⁻-type semiconductive region 10) resistance. A reduction of the channel resistance may allow the on resistance of the trench gate-type power MISFET to be reduced.

After the formation of the gate line, source pad 23 and gate pad, a protective film made, for example, of a polyimide resin film, is applied onto the top of the substrate, exposed to light and developed, thereby removing the polyimide resin film on the tops of the pad and source pad 23 to form openings.

The substrate surface may be protected with a tape, after which the protected surface is laid downward and the n⁺-type single crystal silicon substrate 1A is polished at the back surface. Conductive films such as, for example, a Ti (titanium) film, an Ni (nickel) film and an Au (gold) film, are successively deposited on the back surface of the n⁺-type single crystal silicon substrate 1A according to a sputtering method. This stacked film serves as a lead electrode (drain electrode) for the drain (the n⁺-type single crystal silicon substrate 1A and the n⁻-type single crystal silicon substrate 1B).

Thereafter, the tape may be removed, after which bump electrodes made, for example, of gold may be formed over the openings formed in the polyimide resin film. The substrate in wafer state is subjected to dicing, for example, along the division regions (not shown) into individual chips.

The individual chips are, respectively, mounted, for example, on a lead frame (packaging sheet) having external terminals and sealed (packaged) with a resin or the like, thereby providing semiconductor devices of exemplary embodiment 1.

A semiconductor device of exemplary embodiment 2 has an n-channel trench gate-type power MISFET wherein the breakdown voltage between the source and drain may be about 100 V or below, like the semiconductor device of the foregoing Embodiment 1.

Figure 13:
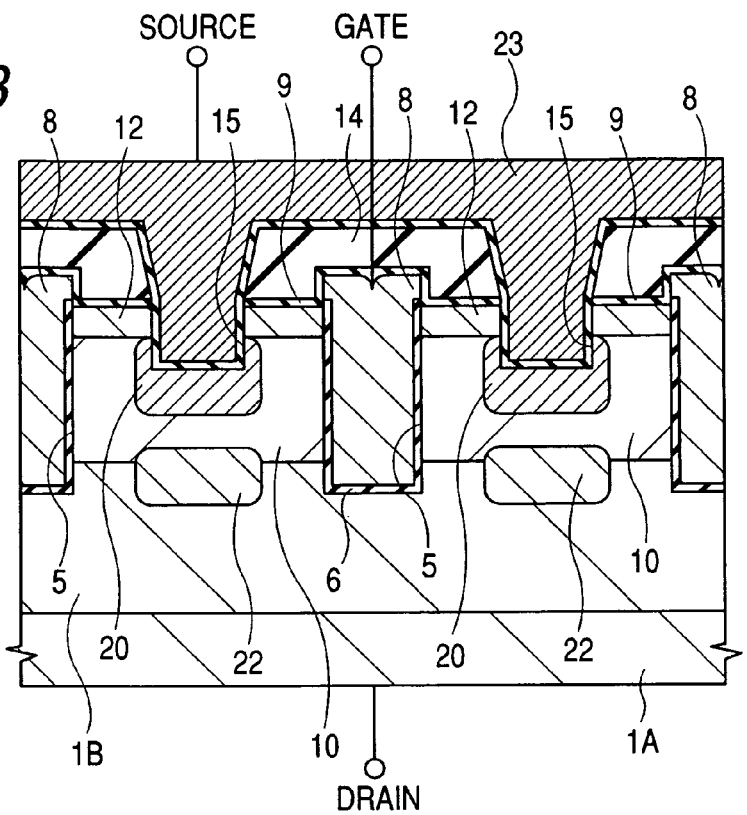
FIG. 13 is a sectional view of a semiconductor device.

As shown in FIG. 13, the p-type semiconductive region 21 (see FIG. 7) is omitted. Through the omission of the p-type semiconductive region 21, a neutral base region (i.e. a region not depleted among bases beneath the emitters of parasitic npn-type bipolar transistors provided with the n⁻-type single crystal silicon substrate 1B as a collector, the p⁻-type semiconductive region 10 as a base and the n⁺-type semiconductive region 12 as an emitter) becomes narrow, with the apprehension that a desired degree of avalanche withstand may not be secured in the trench gate-type power MISFET. If the depth at which the n-type semiconductive region 22 is to be formed is changed, a desired level of avalanche withstand may be ascertained. When the depth at which the n-type semiconductive region 22 is small, the breakdown voltage lowers along with a small width of depletion layer at the time of avalanche breakdown and a broadened neutral base region, thereby improving the avalanche withstand. When the depth at which the n-type semiconductive region 22 is large, the breakdown voltage is improved, so that the width of depletion layer at the time of avalanche breakdown is broadened with a narrower neutral base region. Thus, the avalanche withstand slightly lowers. While taking into account such an interrelation as set out above, the depth at which the n-type semiconductive region 22 may be set.

The p-type semiconductive region 21 (see FIG. 7) is omitted, so that the number of manufacturing steps of the semiconductor device can be reduced. This may permit the time for completion of the semiconductor device to be shortened.

A semiconductor device may have an n-channel, trench gate-type power MISFET wherein the breakdown voltage between the source and drain is about 100 V or below.

A parasitic capacitance wherein a silicon oxide film 6, which may be a gate insulating film of the trench gate-type power MIFET, may act as a capacitive insulating film, and a gate electrode 8 may act as a capacitive electrode may be reduced so as to improve a switching speed of the trench gate-type power MISFET. The groove 5 may be formed shallower than previously discussed. As shown in FIG. 13, the p-type semiconductive region 21 is omitted, and the p⁺-type semiconductive region 20 may be formed to reach the junction face between the p⁻-type semiconductive region 10 and the n⁻-type single crystal silicon substrate 1B (n-type semiconductive region 22). With this, the avalanche breakdown point may be positively formed based on the junction between the p⁺-type semiconductive region 20 and the n-type semiconductive region 22. This permits an electron current to flow from the avalanche breakdown point toward the n⁺-type single crystal silicon substrate 1A, and a hole current to flow toward the p⁺-type semiconductive region 20. This may enable the suppression of the operation of a parasitic npn-type bipolar transistor wherein the n⁻-type single crystal silicon substrate 1B is provided as a collector, the p⁻-type semiconductive region 10 provided as a base, and the n⁺-type semiconductive region 12 provided as an emitter. Thus, the avalanche withstand of the trench gate-type power MISFET may be improved. Since the groove 5 may be shallow, it may be unnecessary to increase the energy required for the introduction of impurity ions when the p$^+$-type semiconductive region 20 and the n-type semiconductive region 22 are formed. This may allow the width of distribution of impurity ions along a direction parallel to the main surface of the substrate in the course of the formation of the p$^+$-type semiconductive region 20 and the n-type semiconductive region 22 to be suppressed from being broadened. While improving the avalanche withstand of the trench gate-type power MISFET, the cell pitches of the trench gate-type power MISFET may be reduced.

Figure 14:
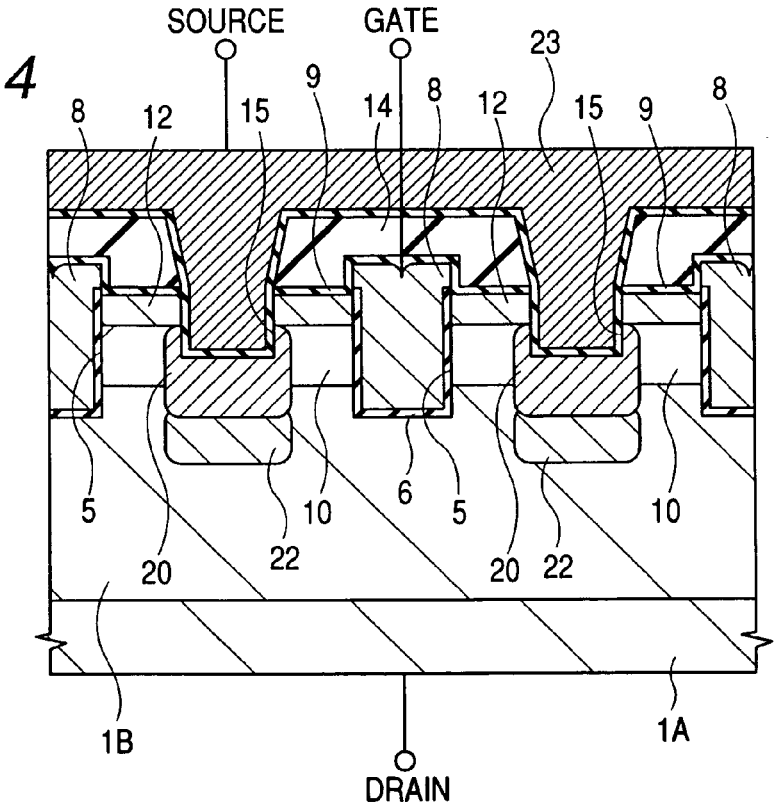
FIG. 14 is a sectional view of a semiconductor device.
Figure 15:
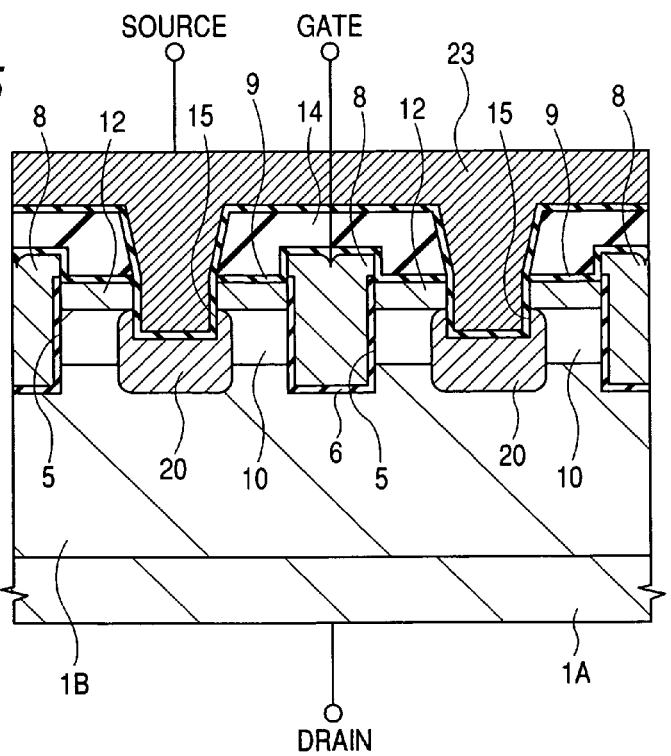
FIG. 15 is a sectional view of the semiconductor device.
Figure 16:
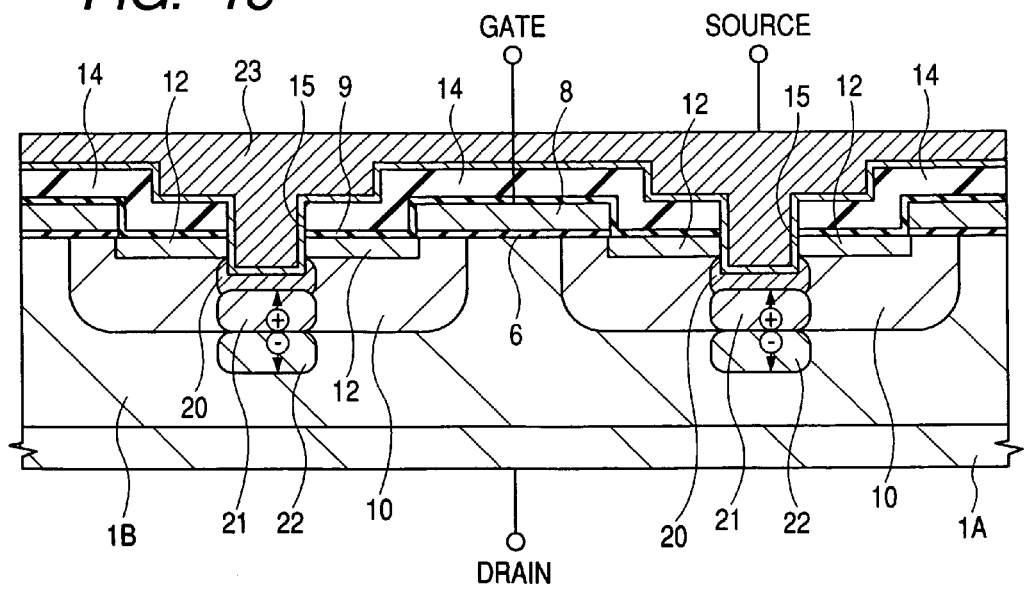
FIG. 16 is a sectional view a semiconductor device.

As shown in FIG. 16, the n-type semiconductive region 22 is omitted, and the avalanche breakdown point may be formed on the basis of the junction between the p$^+$-type semiconductive region 20 and the n$^-$-type single crystal silicon substrate 1B. This may allow the number of manufacturing steps of the semiconductor device to be reduced over the case wherein the structure shown in FIG. 14. Moreover, while reducing the number of the steps of manufacturing the semiconductor device, it becomes necessary to form the p$^+$-type semiconductive region 20 more deeply than in the structure shown in FIG. 14 for the reason that the junction between the p$^+$-type semiconductive region 20 and the n$^-$-type single crystal silicon substrate 1B needs to be reliably formed. The structure shown in FIG. 14 permits the avalanche breakdown point to be formed at a position distant from the side surface of the groove 5. Such a structure may create an unlikelihood of degrading characteristics, such as threshold voltage and on resistance, of the trench gate-type power MISFET than the structure shown in FIG. 15.

A semiconductor device may have an n-channel, planar gate-type power MISFET wherein the breakdown voltage between the source and drain is, for example, about 100 V or below.

Figure 17:
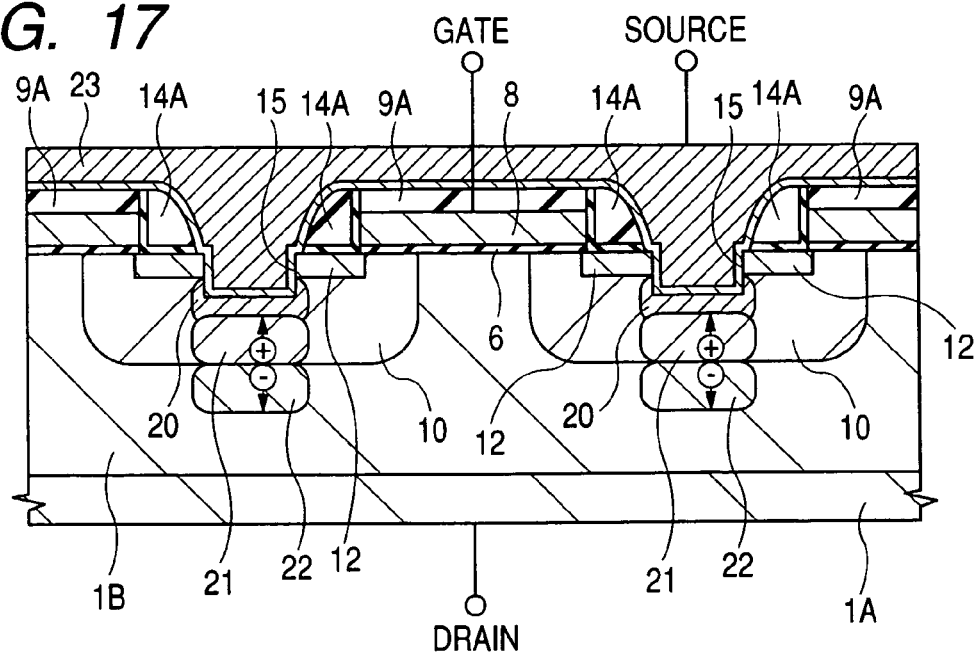
FIG. 17 is a sectional view of the semiconductor device.
Figure 18:
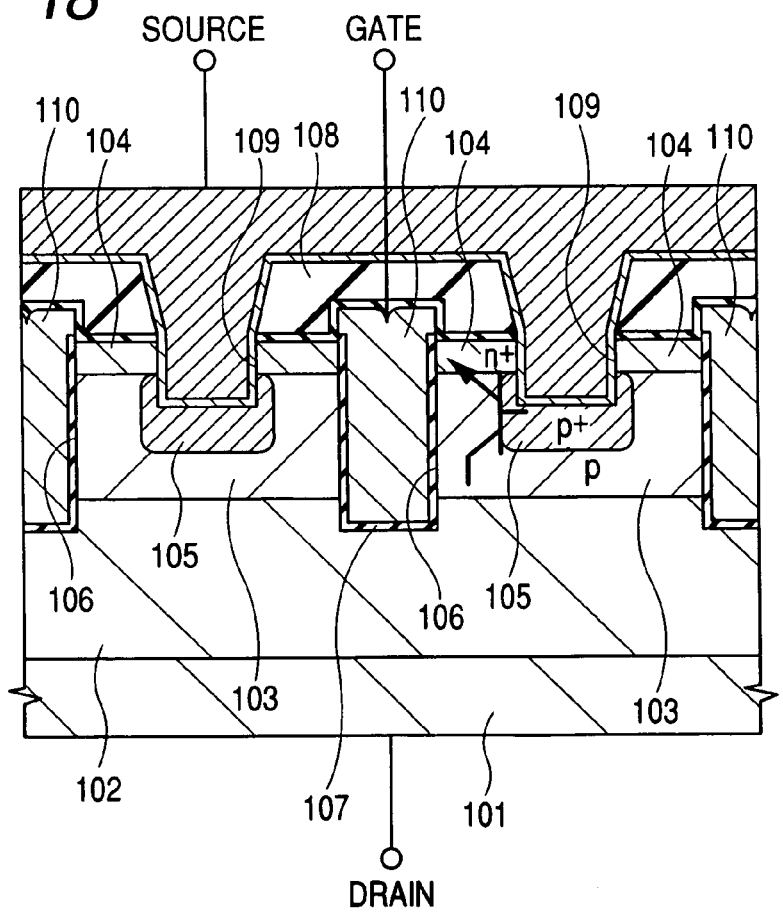
FIG. 18 is a sectional view of a semiconductor device.

FIGS. 16 and 17 are, respectively, a sectional view of an essential part of a planar gate-type power MISFET. A gate electrode 8 is formed on the substrate as arranged between two adjacent p$^-$-type semiconductive regions 10 without providing a groove 5 (see, for example, FIGS. 11 and 13 to 15) for forming the gate electrode 8 illustrated in connection with the foregoing.

With the structure shown in FIG. 16, a contact groove 15 may be formed by etching an insulating film 14 and a substrate through a mask of a photoresist film patterned according to a photolithographic technique. With the structure shown in FIG. 17, a contact hole 15 may be formed in the following way: Prior to patterning of the gate electrode 8 by etching, a silicon oxide film is, for example, deposited on the substrate, and silicon oxide film is patterned at the time of formation of the gate electrode 8 to form a cap insulating film (first insulating film) 9A. Next, a silicon oxide film may be deposited over the substrate and anisotropically etched to form side wall spacers (fist insulating film) 14A on the side walls of the gate electrode 8 and the cap insulating film 9A. Thereafter, the substrate may be etched through the cap insulating film 9A and the side wall spacers 14A to self-alignedly form the contact hole 15.

In a planar gate-type power MISFET, the avalanche breakdown point is positively formed based on the junction between the p-type semiconductive region 21 and the n-type semiconductive region 22. An electron current flows from the avalanche breakdown point toward the n$^+$-type single crystal silicon substrate 1A, and a hole current flows toward the p$^+$-type semiconductive region 20. In this manner, the operation of a parasitic npn-type bipolar transistor wherein the n$^-$-type single crystal silicon substrate 1B is used as a collector, the p$^-$-type semiconductive region 10 provided as a base and the n$^+$-type semiconductive region 12 provided as an emitter can be suppressed, thereby leading to an improved avalanche withstand of the planar gate-type power MISFET of Embodiment 4.

When the p-type conductive region 21 is formed, the width of distribution of impurity ions along a direction parallel to the main surface of the substrate can be suppressed from being broadened. While improving the avalanche withstand of the planar gate-type power MISFET, the cell pitch of the planar gate-type power MISFET may be reduced.

The reduction of the cell pitch enables the cells to be formed at high density. High densification of the cells may result in an increased number of parallel connections of channels of the planar gate-type power MISFET, thereby reducing channel resistance. The reduction of the channel resistance may lead to the reduction of on resistance of the planar gate-type power MISFET.

More particularly the manufacturing steps of forming the p$^-$-type semiconductive region may use a channel after the formation of the grooves wherein the gate electrode of the trench gate-type power MISFET may be formed and also of the gate electrode. The grooves in which the gate electrode may be formed and the gate electrode may be formed after the formation of the p$^-$-type semiconductive region.

The semiconductor device according to the invention includes a power MISFET having a great avalanche withstand and may be applied to power switching such as of a switch regulator that is not destroyed even if an excess spike voltage generates.

If not otherwise stated herein, it may be assumed that all components and/or processes described heretofore may, if appropriate, be considered to be interchangeable with similar components and/or processes disclosed elsewhere in the specification. It should be appreciated that the systems and methods of the present invention may be configured and conducted as appropriate for any context at hand. The embodiments described hereinabove are to be considered in all respects only as illustrative and not restrictive. As such, all modifications and variations of the present invention that come within the meaning, range, and equivalency of the claims hereinbelow are to be embraced within the scope thereof.

What is claimed is:

1. A semiconductor device including a trench gate type MISFET, the device comprising;
    a semiconductor substrate;
    a drain electrode of the trench gate type MISFET formed on a back surface of the semiconductor substrate;
    a first semiconductor layer formed over a main surface of the semiconductor substrate;
    a plurality of channel layers of the trench gate type MISFET, each formed over the first semiconductor layer;
    a plurality of source regions of the trench gate type MISFET formed over the channel layers, respectively;
    a plurality of gate trenches of the trench gate type MISFET formed between coplanar, adjacent source regions respectively and reaching the first semiconductor layer;
    a plurality of gate insulating films of the trench gate type MISFET formed in the gate trenches respectively;
    a plurality of gate electrodes of the trench gate type MISFET formed on the gate insulating films, respectively;
    a first insulating film formed over the source regions and gate electrodes;

a plurality of contact grooves each formed in the first insulating film between coplanar, adjacent gate electrodes and in contact with the channel layer;
a plurality of semiconductive regions formed under bottoms of the contact grooves respectively, and in contact with the bottom of the contact grooves;
a source electrode formed in the contact grooves and electrically connected with the semiconductive regions,
wherein the semiconductor substrate, first semiconductor layer and source regions have a first conduction type;
wherein the channel layer and semiconductive regions have a second conduction type opposite to the first conduction type;
wherein the semiconductive regions have an impurity concentration higher than the channel layer;
wherein bottoms of the semiconductive regions are closer to the drain electrode, compared with a bottom of the channel layer.

2. A semiconductor device according to claim 1, wherein the first semiconductor layer is formed by an epitaxial growing method.

3. A semiconductor device according to claim 1, wherein the plurality of gate trenches are integrally formed;
the plurality of gate electrodes are integrally formed; and
the plurality of source regions are electrically connected.

4. A semiconductor device according to claim 1, wherein the first and second conduction types are n-type and p-type respectively.

5. A semiconductor device including a MISFET, the device comprising:
a semiconductor substrate;
a drain electrode of the MISFET formed on a back surface of the semiconductor substrate;
a first semiconductor layer formed over a main surface of the semiconductor substrate;
a plurality of channel layers of the MISFET, each formed over the first semiconductor layer;
a plurality of source regions of the MISFET formed over the channel layers, respectively;
a plurality of gate insulating films of the MISFET formed between coplanar, adjacent source regions respectively;
a plurality of gate electrodes of the MISFET formed on the gate insulating films, respectively;
a first insulating film formed over the source regions and gate electrodes;
a plurality of contact grooves each formed in the first insulating film between coplanar, adjacent gate electrodes and in contact with the channel layer;
a plurality of semiconductive regions formed under bottoms of the contact grooves respectively, and in contact with the bottom of the contact grooves;
a source electrode formed in the contact grooves and electrically connected with the semiconductive regions,
wherein the semiconductor substrate, first semiconductor layer and source regions have a first conduction type;
wherein the channel layer and semiconductive regions have a second conduction type opposite to the first conduction type;
wherein the semiconductive regions have an impurity concentration higher than the channel layer;
wherein bottoms of the semiconductive regions are closer to the drain electrode, compared with a bottom of the channel layer.

6. A semiconductor device according to claim 5, wherein the first semiconductor layer is formed by an epitaxial growing method.

* * * * *